United States Patent
Van Kampen et al.

(10) Patent No.: US 9,589,731 B2
(45) Date of Patent: Mar. 7, 2017

(54) MEMS VARIABLE CAPACITOR WITH ENHANCED RF PERFORMANCE

(75) Inventors: Robertus Petrus Van Kampen, S-Hertogenbosch (NL); Anartz Unamuno, Dresden (DE); Richard L. Knipe, McKinney, TX (US); Vikram Joshi, Mountain View, CA (US); Roberto Gaddi, S-Hertogenbosch (NL); Toshiyuki Nagata, Los Gatos, CA (US)

(73) Assignee: CAVENDISH KINETICS, INC., San Jose, CA (US)

( * ) Notice: Subject to any disclaimer, the term of this patent is extended or adjusted under 35 U.S.C. 154(b) by 258 days.

(21) Appl. No.: 14/240,654

(22) PCT Filed: Sep. 4, 2012

(86) PCT No.: PCT/US2012/053702
§ 371 (c)(1),
(2), (4) Date: Apr. 25, 2014

(87) PCT Pub. No.: WO2013/033725
PCT Pub. Date: Mar. 7, 2013

(65) Prior Publication Data
US 2014/0340814 A1   Nov. 20, 2014

Related U.S. Application Data

(60) Provisional application No. 61/530,666, filed on Sep. 2, 2011.

(51) Int. Cl.
*H01G 5/16* (2006.01)
*H01G 5/18* (2006.01)
(Continued)

(52) U.S. Cl.
CPC .............. *H01G 5/16* (2013.01); *B81B 3/0051* (2013.01); *B81C 1/00158* (2013.01);
(Continued)

(58) Field of Classification Search
CPC ......... H01G 5/16; H01G 5/18; B81C 1/00476
See application file for complete search history.

(56) References Cited

U.S. PATENT DOCUMENTS 5,367,429 A    11/1994  Tsuchitani et al.
6,229,684 B1 *  5/2001  Cowen ..................... F03G 7/06
                                                361/277
(Continued)

FOREIGN PATENT DOCUMENTS

CN     101682315 A    3/2010
JP     5-172846       7/1993
(Continued)

OTHER PUBLICATIONS

International Search Report and Written Opinion issued in PCT/US2012/053702, mailed Nov. 20, 2012.
(Continued)

*Primary Examiner* — David M Sinclair
(74) *Attorney, Agent, or Firm* — Patterson & Sheridan, LLP

(57) ABSTRACT

In a MEMS device, the manner in which the membrane lands over the RF electrode can affect device performance. Bumps or stoppers placed over the RF electrode can be used to control the landing of the membrane and thus, the capacitance of the MEMS device. The shape and location of the bumps or stoppers can be tailored to ensure proper landing of the membrane, even when over-voltage is applied. Additionally, bumps or stoppers may be applied on the membrane itself to control the landing of the membrane on the roof or top electrode of the MEMS device.

13 Claims, 13 Drawing Sheets

(51) Int. Cl.
 *B81B 3/00* (2006.01)
 *B81C 1/00* (2006.01)
(52) U.S. Cl.
 CPC ...... *B81C 1/00476* (2013.01); *B81C 1/00523* (2013.01); *H01G 5/18* (2013.01)

(56) References Cited

U.S. PATENT DOCUMENTS

| | | | | |
|---|---|---|---|---|
| 6,791,441 | B2* | 9/2004 | Pillans | B81B 3/0008 335/78 |
| 6,833,985 | B2* | 12/2004 | Fujii | H01H 59/0009 361/278 |
| 7,141,989 | B1* | 11/2006 | Liu | H01G 5/014 257/312 |
| 7,261,793 | B2 | 8/2007 | Chen et al. | |
| 7,586,164 | B2 | 9/2009 | Musalem et al. | |
| 8,363,380 | B2* | 1/2013 | Lan | H01P 1/127 361/281 |
| 2002/0018334 | A1* | 2/2002 | Hill | F03G 7/06 361/278 |
| 2002/0131230 | A1* | 9/2002 | Potter | H01G 5/16 361/277 |
| 2006/0056132 | A1* | 3/2006 | Yoshida | H01G 5/0136 361/294 |
| 2006/0226501 | A1* | 10/2006 | Allen Chou | H01G 5/16 257/415 |
| 2008/0151468 | A1 | 6/2008 | Morris et al. | |
| 2009/0001845 | A1* | 1/2009 | Ikehashi | B81B 3/0021 310/300 |
| 2010/0116632 | A1* | 5/2010 | Smith | B81B 7/04 200/181 |
| 2010/0214716 | A1* | 8/2010 | Liu | B81B 3/0072 361/290 |
| 2010/0263998 | A1 | 10/2010 | Anderson et al. | |
| 2010/0328840 | A1* | 12/2010 | Yamazaki | H01G 5/16 361/281 |
| 2011/0043960 | A1* | 2/2011 | Ikehashi | H01G 5/16 361/207 |
| 2011/0063774 | A1* | 3/2011 | Ikehashi | H01G 5/011 361/281 |
| 2012/0103768 | A1* | 5/2012 | Bachman | H01H 59/0009 200/181 |
| 2014/0284767 | A1* | 9/2014 | Yamazaki | H01G 5/18 257/600 |
| 2015/0092315 | A1 | 4/2015 | Steeneken et al. | |

FOREIGN PATENT DOCUMENTS

| | | |
|---|---|---|
| JP | 2003-264123 A | 9/2003 |
| JP | 2010-251321 A | 11/2010 |
| JP | 2011-011325 A | 1/2011 |
| JP | 2011-066150 A | 3/2011 |
| WO | 2010/054244 A2 | 5/2010 |

OTHER PUBLICATIONS

Chinese Office Action (with English translation) for Application No. 201280042774.X dated Feb. 1, 2016; 16 total pages.
Japanese Office Action (with English translation) for Application No. 2014-528699; dated May 25, 2016; 6 total pages.
Office action and supplemental search report dated Aug. 11, 2016 for Chinese Patent Application No. 201280042774.X.

* cited by examiner

TOP BUMPS WITH PATTERNED TOP ELECTRODE

CROSS SECTION VIEW OF TOP BUMP WITH
WITH DIELECTRIC PLUGS IN TOP ELECTRODE

TOP SURFACE OF THE LOWER LAYER OF WAFFLE HITS BOTTOM
SURFACE OF THE UPPER LAYER HANGING OUT FROM THE ANCHOR

CROSS SECTION VIEW OF STOPPERS
HANGING OUT FROM THE ANCHOR

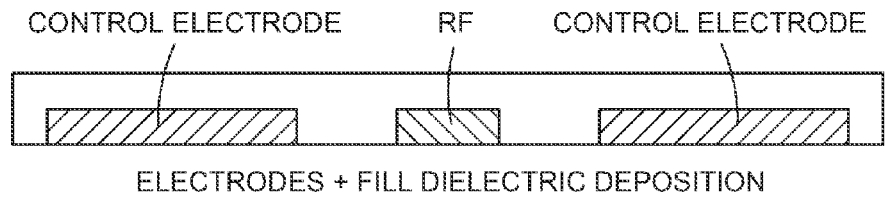
Fig. 6A — ELECTRODES + FILL DIELECTRIC DEPOSITION
Fig. 6B — AFTER CMP (SHOWING DISHING AND BUMPS)
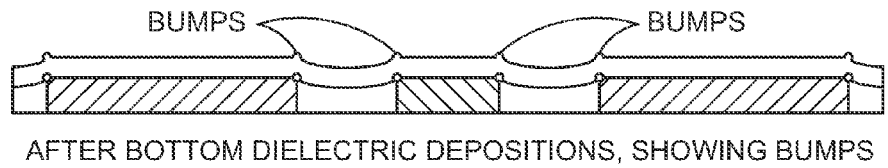
Fig. 6C — AFTER BOTTOM DIELECTRIC DEPOSITIONS, SHOWING BUMPS
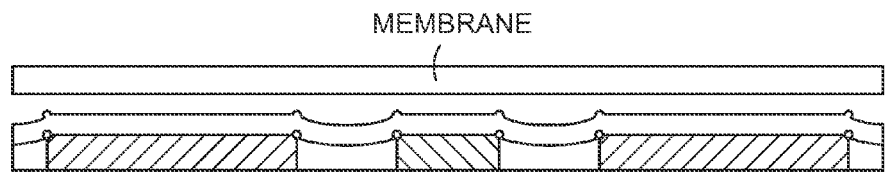
Fig. 6D — WITH PLANARIZING SACRIFICIAL AND MEMS MEMBRANE
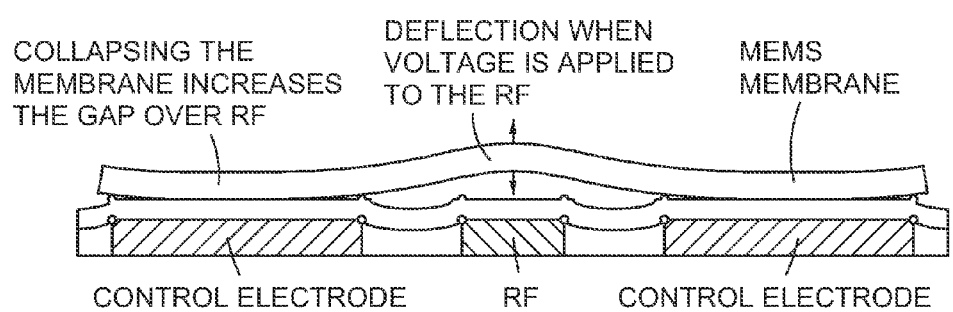
Fig. 7

ELECTRODES + FILL DIELECTRIC DEPOSITION

AFTER CMP (SHOWING DISHING AND BUMPS)

AFTER BOTTOM DIELECTRIC DEPOSITIONS

WITH PLANARIZING SACRIFICIAL AND MEMS MEMBRANE

ELECTRODES + FILL DIELECTRIC DEPOSITION

AFTER CMP (SHOWING DISHING AND BUMPS)

AFTER BUMP-ETCH

AFTER BOTTOM DIELECTRIC DEPOSITION

WITH PLANARIZING SACRIFICIAL AND MEMS MEMBRANE

MEMS VARIABLE CAPACITOR WITH ENHANCED RF PERFORMANCE

BACKGROUND OF THE INVENTION

Field of the Invention

Embodiments of the present invention generally relate to a micro-electromechanical system (MEMS) variable capacitor.

Description of the Related Art

The most frequent way of actuating a MEMS variable capacitor is through the use of electrostatic force. Generally, the voltages required for actuation are in the order of 10V to 100V. Using these voltages imply that the electric fields become very large in the sub-micrometer dimensions used. The electric fields are expressed by the equation E=V/gap where 'V' represents the voltage between two electrodes and 'gap' is the distance between them. Properties of dielectric materials change under high electric fields (e.g., charging), and in some cases there can be physical damage on the dielectrics. These factors reduce the lifespan, performance and operating conditions of the MEMS digital variable capacitors.

Therefore, there is a need in the art to reduce the magnitude of the electric field in a MEMS variable capacitor while maintaining a high capacitance state when the MEMS is landed.

Additionally, inter-modulation performance for RF-MEMS variable capacitors is a difficult specification to meet. This is because the MEMS devices contain movable parts that provide the tuning of the capacitance. RF voltages between the two electrodes attract the two plates of the MEMS variable capacitor further together if there is any remaining gap, forcing a further capacitance change. Depending on the MEMS device electromechanical design and on the intended application inter-modulation specifications, the maximum allowed movement can be as small as few nanometers for an applied voltage between the two plates of the variable capacitor of several volts.

Even surface treatments such as chemical mechanical polish (CMP) can be insufficient for good inter-modulation performance. For example, after chemical mechanical polishing (CMP), some bumps can appear at the metal-dielectric interface. These bumps can have dramatic effects on the RF performance as they create extra gaps where the membrane can deflect. Also the oxide surface itself after CMP can sit elevated with respect to the metal surface, leading to gaps between the membrane and the electrodes. Additionally, the CMP bumps act as electric field intensifiers which again lower the reliability of the part.

Therefore, there is a need in the art for a solution to address the possible inter-modulation issues while keeping the electric fields low enough for long reliable operation.

SUMMARY OF THE INVENTION

In a MEMS device, the manner in which the membrane lands over the RF electrode can affect device performance. Bumps or stoppers placed over the RF electrode can be used to control the landing of the membrane and thus, the capacitance of the MEMS device. The shape and location of the bumps or stoppers can be tailored to ensure proper landing of the membrane, even when over-voltage is applied. Additionally, bumps or stoppers may be applied on the membrane itself to control the landing of the membrane on the roof or top electrode of the MEMS device.

In one embodiment, a MEMS variable capacitor comprises a substrate having one or more control electrodes and one or more RF electrodes disposed therein; a top electrode; and a membrane movable between the substrate and the top electrode, wherein one or more of the substrate and the membrane have bumps formed thereover to control the spacing between the membrane and either the top electrode or both the one or more control electrodes and one or more RF electrodes.

In another embodiment, a method of fabricating a MEMS variable capacitor is disclosed. The method comprises polishing a first dielectric layer that is formed over a substrate so as to expose one or more control electrodes and one or more RF electrodes embedded within the substrate, the polishing resulting in bumps formed at upper surface edges of the one or more control electrodes and the one or more RF electrodes; depositing a second dielectric layer; depositing a sacrificial layer over the second dielectric layer; forming a membrane over the sacrificial layer; and removing the sacrificial layer such that the membrane is movable from a position spaced from the second dielectric layer and a position in contact with the second dielectric layer.

In another embodiment, a method of operating a MEMS device comprises applying an electrical bias to one or more control electrodes embedded within a substrate to move a membrane from first position spaced a first distance from an RF electrode that is embedded within the substrate to a second position spaced a second distance from the RF electrode, wherein the second distance is less than the first distance; and applying a DC electrical bias to the RF electrode to move the membrane to a third distance spaced from the RF electrode, wherein the third distance is less than the second distance.

In one embodiment, a bump disposed over one or more slotted RF electrodes extends above the substrate for a distance that is substantially equal to a distance that bumps disposed over the one or more slotted control electrodes extend.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 6A-6D shows a simplified fabrication process for a MEMS variable capacitor where after doing a CMP to planarize the electrodes with the dielectric, dishing issues and bumps appear.

FIG. 7 show a MEMS beam in contact with the bottom dielectric deformed due to bumps. When RF voltage is applied the membrane moves as shown with the arrow, changing the RF capacitance, and therefore degrading the RF performance.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In a MEMS device, the manner in which the membrane lands over the RF electrode can affect device performance. Bumps or stoppers placed over the RF electrode can be used to control the landing of the membrane and thus, the capacitance of the MEMS device. The shape and location of the bumps or stoppers can be tailored to ensure proper landing of the membrane, even when over-voltage is applied. Additionally, bumps or stoppers may be applied on the membrane itself to control the landing of the membrane on the roof or top electrode of the MEMS device.

Figure 1A:
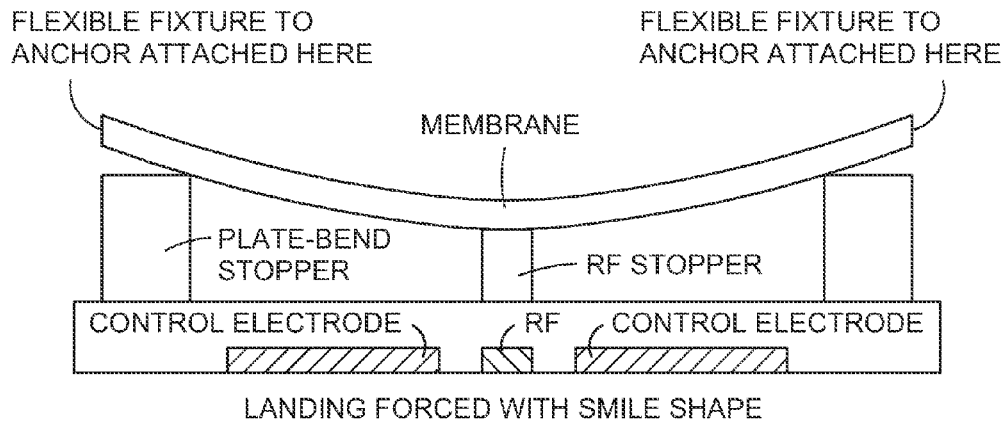
FIGS. 1A-1C are schematic illustrations of approaches for controlling e-fields during pull-down of a variable capacitor.
Figure 1B:
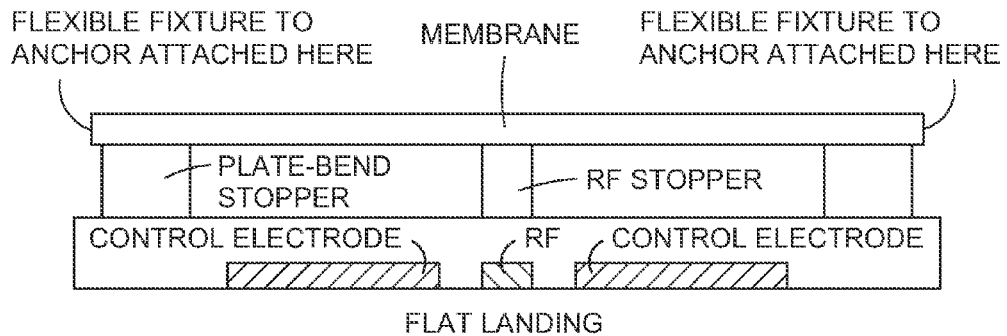
Figure 1C:
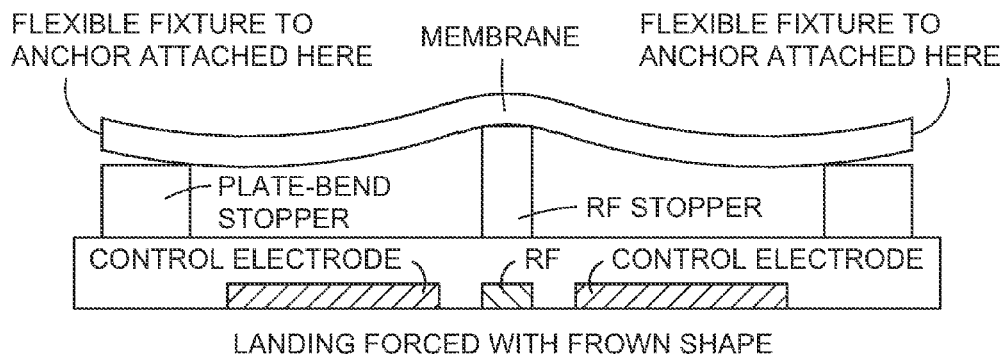

Three approaches for controlling the E-fields during pull-down of the variable capacitor are described in FIGS. 1A-1C. The difference between the three modes is the shape that the membrane is forced to take when actuated. In the three cases, there is an extra gap on top of the actuating electrode (i.e., the "control electrode"), where the voltages are highest. The depth of the gap, which is generally equivalent to the height of the plate bend stopper and RF stopper in FIG. 1B or a distance between the height of the RF stopper and plate bend stopper in FIGS. 1A and 1C, over the actuating electrode is sized to dramatically lower the electric fields and to allow the resultant downward forced to be reacted by the RF electrode instead of being reacted by contact over the control electrode. The depth of the gap is selected in such a manner so that average electric field is less than 3 MV/cm without significantly increasing the actuation voltage (due to increased gap). The gap over the actuating electrode, shown in FIGS. 1A-1C, can be achieved by wafer processing in several ways. One example is to etch the dielectric over the actuation electrode by using a mask that protects the dielectric over RF electrode. The thickness of dielectric removed is determines the depth of the gap. Another approach is to insert a floating metal sandwiched between dielectric stack over the RF electrode. The thickness of the floating metal over RF electrode is determines the depth of the gap over actuating electrode. A third approach is to deposit and pattern an extra layer of dielectric just over the RF electrode thereby creating an equivalent gap over the actuating electrodes.

FIGS. 1A-1C show E-field control methods with RF and Plate-Bend stoppers height combinations. FIG. 1A shows where the membrane is forced to land in a smile shape because the RF stopper extends a shorter distance above the substrate than the plate-bend stoppers. FIG. 1B shows where the membrane lands flat because the plate-bend stoppers extend the same distance above the substrate as the RF stopper. FIG. 1C shows where the membrane is forced to land in a frown shape because the RF stopper extends a longer distance above the substrate than the plate-bend stoppers.

Figure 2A:
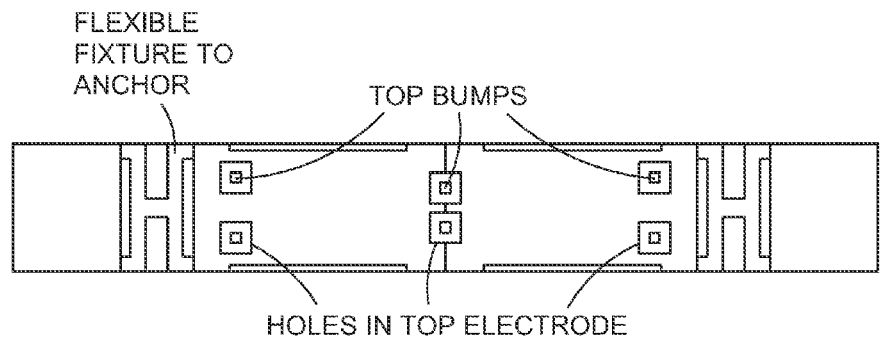
FIG. 2A is a top view.
Figure 2B:
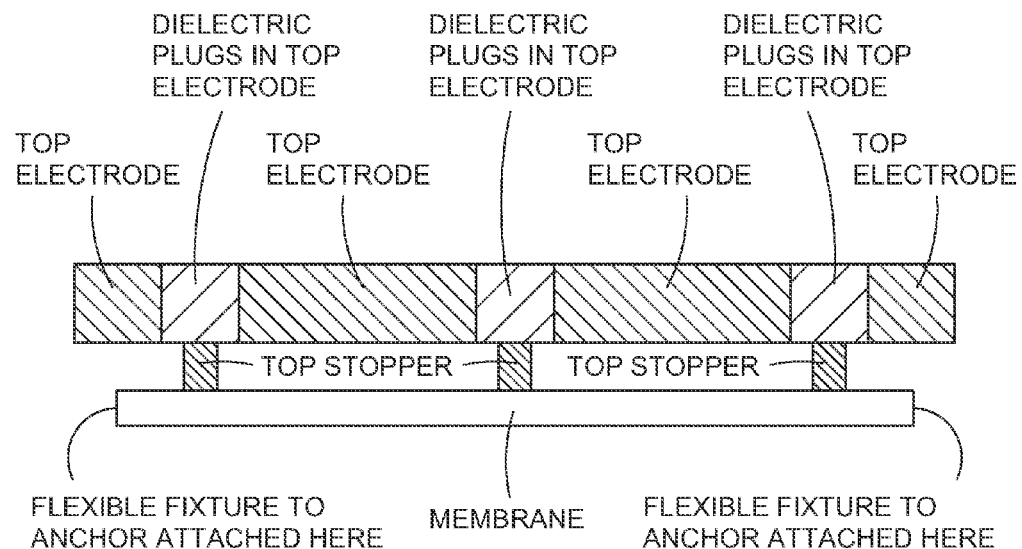
FIG. 2B is a cross-section view for E-field control implementation for top electrode with top bumps and patterned top electrode.

Electric-fields should also be reduced in the top operation of the digital variable capacitor. FIGS. 2A, 2B, 3A and 3B show two approaches for it. FIGS. 2A and 2B show an approach where top bumps/stoppers are used to reduce e-fields, and the top electrode is patterned so that the bumps/stoppers land on regions with no voltage applied (i.e., the dielectric plugs), making sure the E-fields are low. FIG. 2A is a top view, and FIG. 2B is a cross-section view for E-field control implementation for top electrode with top bumps/stoppers and patterned top electrode. As shown in FIGS. 2A and 2B, the membrane has stoppers that extend therefrom that land on the dielectric plugs formed in the top electrode. Thus both the stoppers and the dielectric plugs are strategically placed. As compared to FIGS. 1A-1C where the stoppers are present on the substrate and not the membrane, the stoppers are on the top of the membrane in FIGS. 2A and 2B. It is contemplated that FIGS. 1A-1C and 2A-2B can be combined such that stoppers are present on the substrate (as in FIGS. 1A-1C) as well as on the top of the membrane for when the membrane moves away from the substrate and towards the top electrode (as in FIGS. 2A-2B).

Figure 3A:
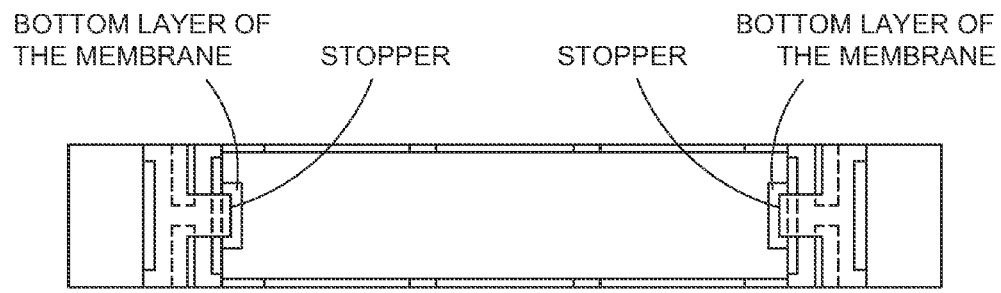
FIG. 3A is a top view.
Figure 3B:
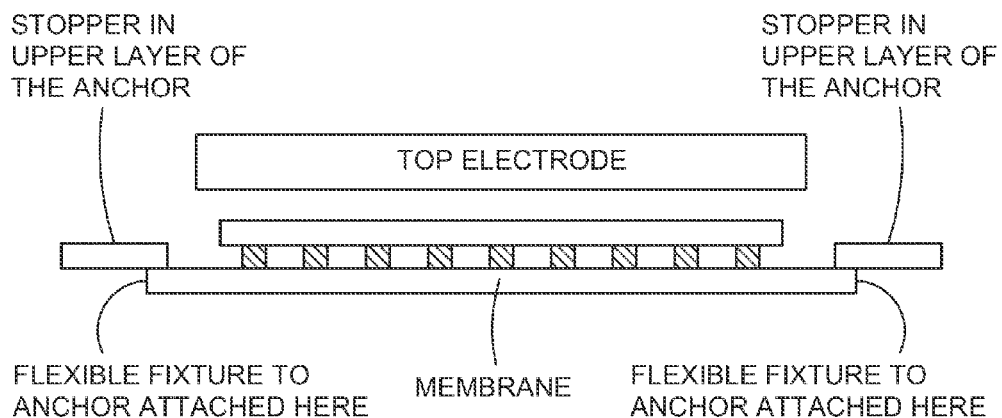
FIG. 3B is a cross-sectional view of a lower waffle layer stopping on anchored upper layer.

FIGS. 3A and 3B show the approach where the lower layer of the membrane hits the upper layer that extends from the anchor. This prevents the membrane from making contact to the roof (shown as a top electrode in FIG. 3B), by forcing a gap in between them. An addition to this design feature could be the use of top bumps/stoppers and/or patterned top electrode (as shown in FIGS. 2A-2B) to make sure that even if the membrane comes into contact, the locations where contact happens, are low/non voltage regions, reducing the E-fields. FIG. 3A is a top view, and FIG. 3B is a cross-sectional view of a lower waffle layer stopping on upper anchor layer. It is contemplated that FIGS. 1A-1C, 2A-2B and 3A-3B can be combined such that stoppers are present on the substrate (as in FIGS. 1A-1C) as well as on the top of the membrane (as in FIGS. 2A-2B) and on the upper layer of the anchor (as shown in FIGS. 3A-3B) for when the membrane moves away from the substrate and towards the top electrode (as in FIGS. 2A-2B and 3A-3B).

Figure 4:
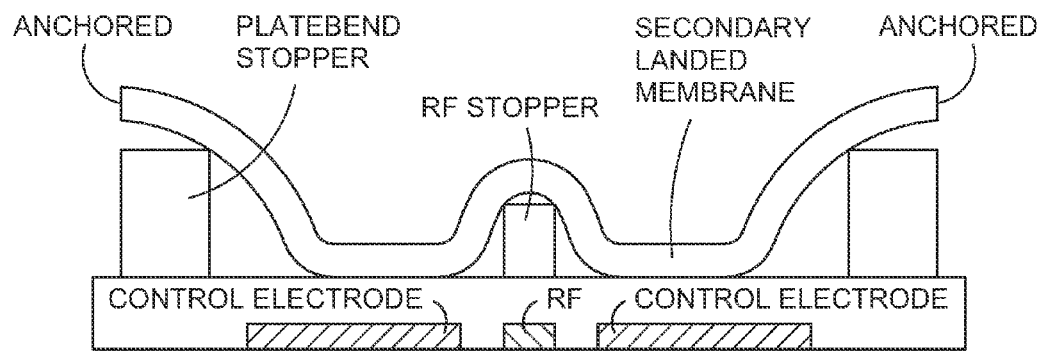
FIG. 4 shows a secondary landing of the membrane on the control electrodes is a possible issue.
Figure 5:
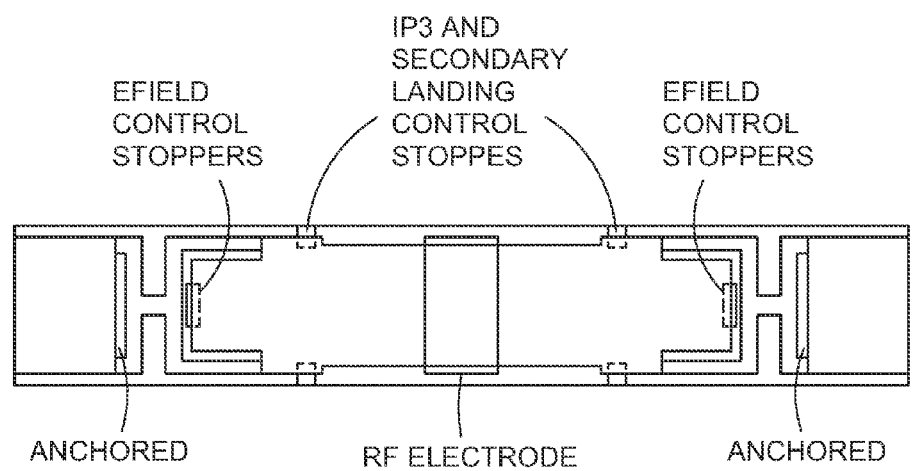
FIG. 5 shows stoppers along the membrane to avoid sagging, and therefore improve IP3 performance and reliability.
Figure 8A:
FIGS. 8A-8D show a simplified process description of the slotted RF and control electrode implementation.
Figure 8B:
Figure 8C:
Figure 8D:
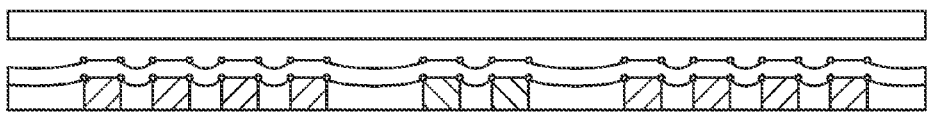
Figure 13:
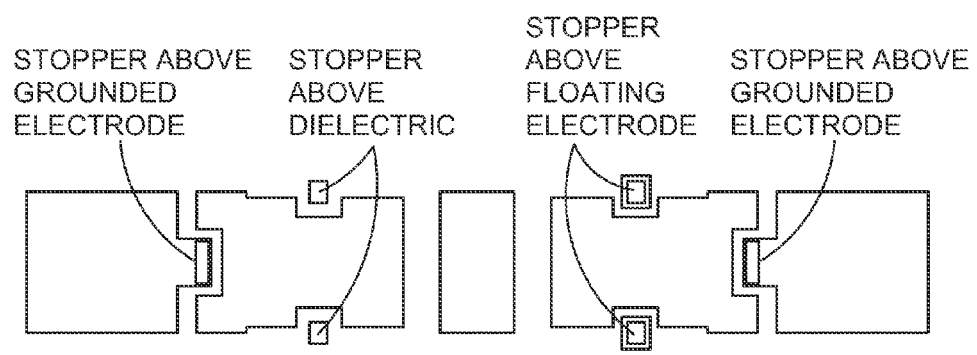
FIG. 13 shows different implementations for controlling the electric field on the bumps and stoppers.

A possible issue of this approach (applicable to both top and bottom operation) is shown in FIG. 4. In this case, the membrane collapses to the control electrode, and large electric fields are present in the collapsed locations, compromising the reliability of the device and reducing the inter-modulation performance (creation of gap on top of the RF electrode). A solution to this issue is presented in FIG. 5, where bumps located along the membrane make sure that the margin between the operating voltage and the collapsing voltage are high enough, and also minimize the gaps created over the RF electrode. In order to reduce the electric fields in the regions of the stoppers, the control electrode should be removed from underneath these stoppers. The bumps and stoppers can be placed above: (1) a grounded electrode, (2) a floating electrode piece of metal or (3) over dielectric and spaced from the control electrodes, as shown in FIG. 13. Options (1) and (3) reduce the electric fields on the bumps and option (2) is used to obtain a better control over the heights of the bumps/stoppers.

There is an advantage to controlling the E-fields on RF MEMS variable capacitors. Specifically, the dielectrics do not get stressed under high electric fields. Additionally, reliability of the device improves dramatically. However, the extra gap in the pull-in area allows the membrane to sag and eventually secondarily land on the control electrode area and therefore the RF gap can vary reducing inter-modulation performance, but the addition of stubs/bumps along the control electrode will mitigate the issue.

Figure 12A:
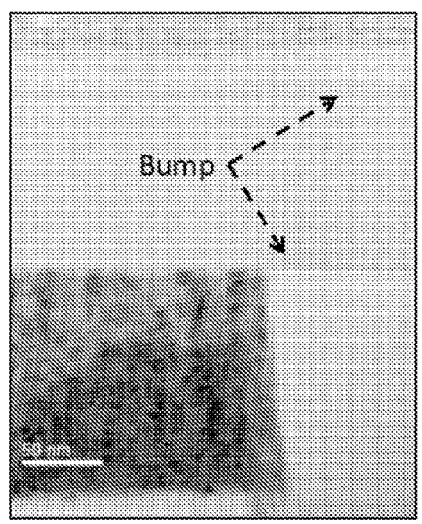
FIG. 12A shows a bump seen after deposition of bottom dielectric.

FIGS. 6A-6D shows a simplified fabrication process for a MEMS variable capacitor where after doing a CMP to planarize the electrodes with the dielectric, dishing issues and bumps appear. A TEM image is shown in FIG. 12A confirming this issue. These bumps translate to the dielectric layer deposited on top of the control electrodes, and as shown in FIG. 7, these features on the dielectric allow for the membrane to deflect under RF voltage, which reduces the inter-modulation performance. There are two solutions discussed herein. One solution is to utilize slotted RF and control electrodes. Another solution is to etch the bumps.

As shown in FIGS. 6A-6D, a substrate has two control electrodes and an RF electrode disposed therein with a dielectric layer formed thereover. The dielectric layer may be polished back using a CMP process or other technique such as grinding so as to expose the control electrodes and the RF electrode. In so doing, bumps/stoppers are formed over at the upper surface edges of the electrodes. The bumps/stoppers are formed of the dielectric material. Thereafter, another dielectric layer may be deposited thereover, but in so forming, the bumps/stoppers carry through such that the bumps/stoppers are not present in the now deposited dielectric layer. Thereafter, a sacrificial layer may be formed thereover and the membrane may be formed thereover. The sacrificial layer will eventually be removed so that the membrane may move from a position spaced from the dielectric layer to a position in contact with the dielectric layer. The membrane will move when an electrical bias is applied to the control electrodes. Additionally, the membrane can be deflected (as shown in FIG. 7), but applying an RF voltage to the RF electrode.

Slotted RF and Control Electrodes

Figure 9:
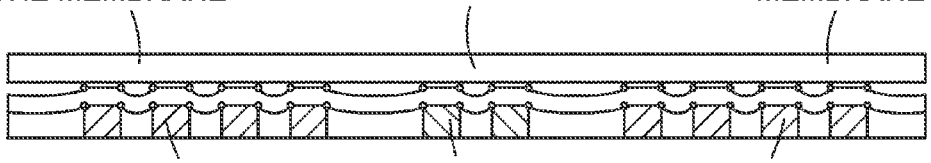
FIG. 9 shows slotted control and RF electrodes combined mitigate the collapsing membrane on the control and RF electrodes.
Figure 10A:
FIGS. 10A-10E show a simplified process description for an etch solution only.
Figure 10B:
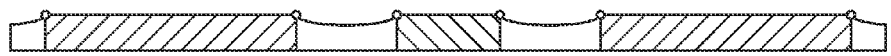
Figure 10C:
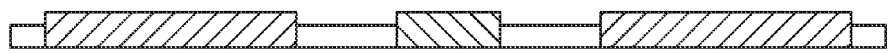
Figure 10D:
Figure 10E:
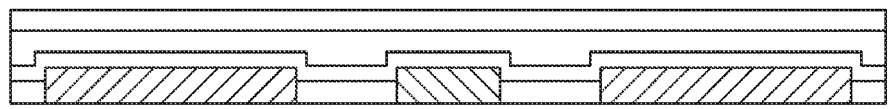

The slotted RF and control solution shown in FIGS. 8A-8D is based on increasing the stiffness of the membrane between the bumps, which, can be achieved by shortening the distance between two consecutive bumps. Slotting the electrodes provides this solution. The section of membrane between two consecutive bumps is shorter as shown in FIG. 9, and therefore the deflection for a given electric voltage is smaller than the design with the larger distance between bumps.

As shown in FIGS. 8A-8D, a substrate has two slotted-control electrodes and a slotted-RF electrode disposed therein with a dielectric layer formed thereover. The electrodes are "slotted" in that rather than a single, large electrode, the electrode is broken up into several smaller pieces that are spaced apart by dielectric material. The dielectric layer may be polished back using a CMP process or other technique such as grinding so as to expose the slotted-control electrodes and the slotted-RF electrode. In so doing, bumps/stoppers are formed over at the upper surface edges of the slotted-electrodes. The bumps/stoppers are formed of the dielectric material. Thereafter, another dielectric layer may be deposited thereover, but in so forming, the bumps/stoppers carry through such that the bumps/stoppers are not present in the now deposited dielectric layer. Thereafter, a sacrificial layer may be formed thereover and the membrane may be formed thereover. The sacrificial layer will eventually be removed so that the membrane may move from a position spaced from the dielectric layer to a position in contact with the dielectric layer. The membrane will move when an electrical bias is applied to the control electrodes. Additionally, the membrane can be deflected (as shown in FIG. 9), but applying an RF voltage to the slotted-RF electrode.

Figure 14A:
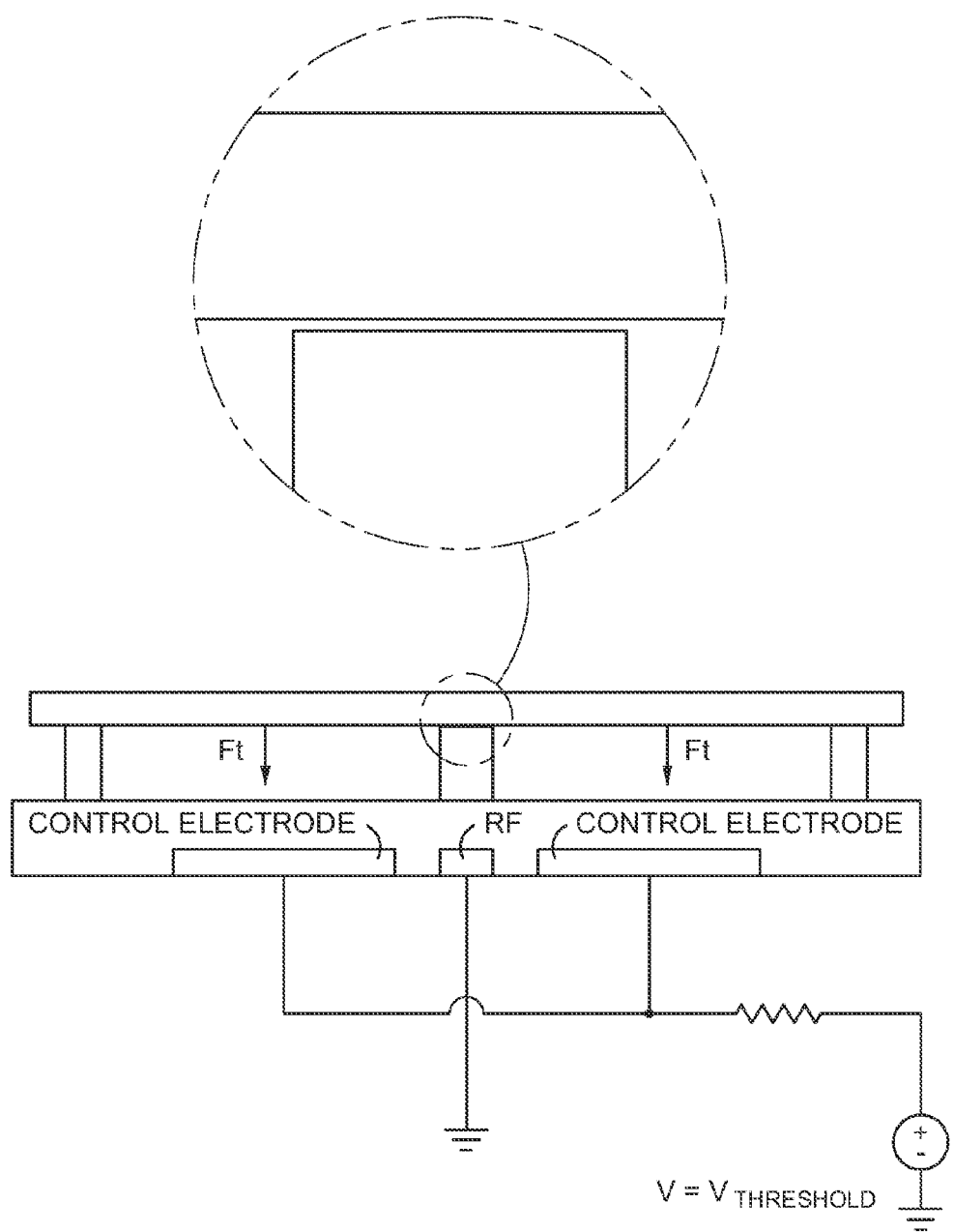
FIGS. 14A-D shows a design exploiting the reduced E-field design in order to limit inter-modulation distortion by coupling of the RF signal to the ac-floating control electrodes.
Figure 14B:
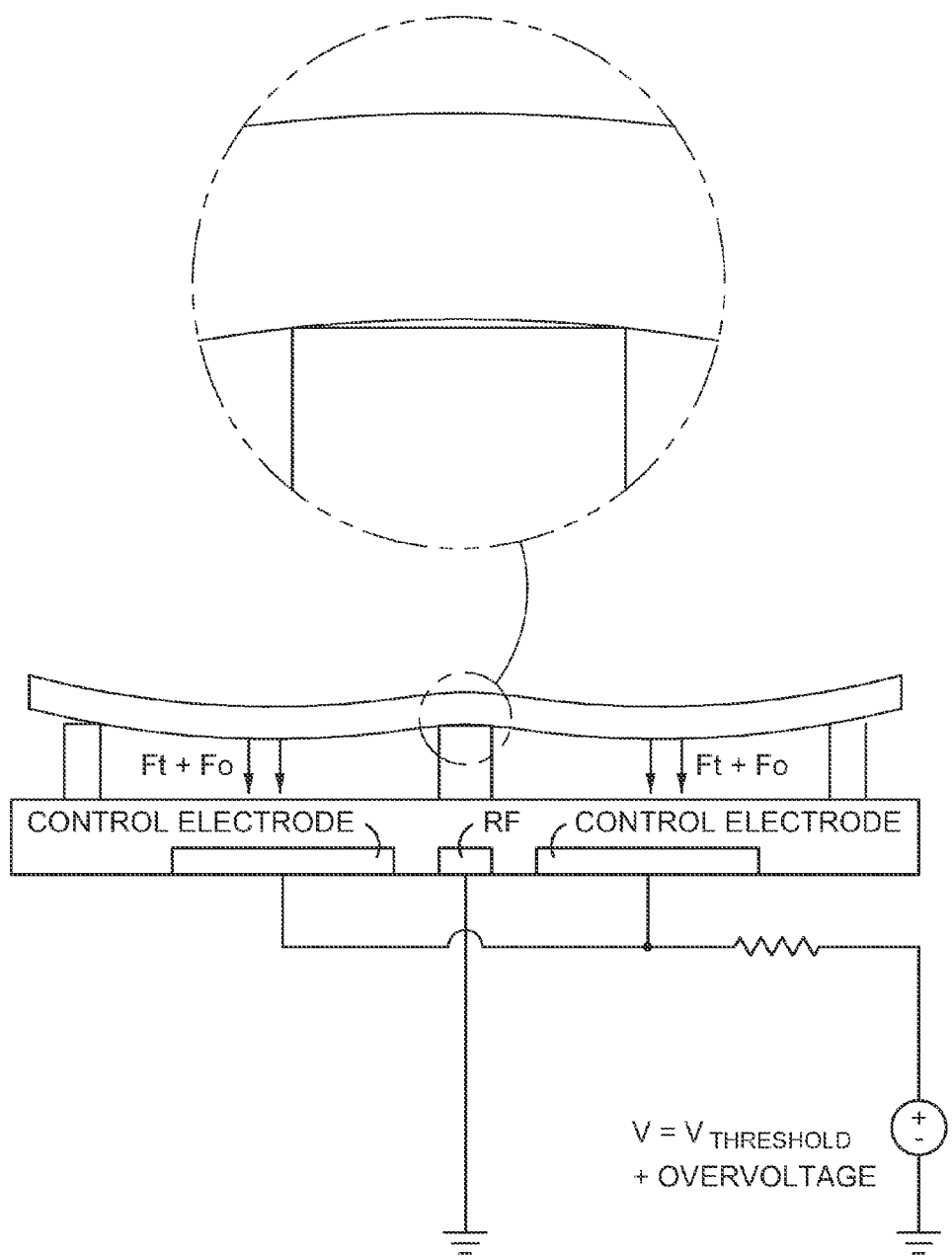
Figure 14C:
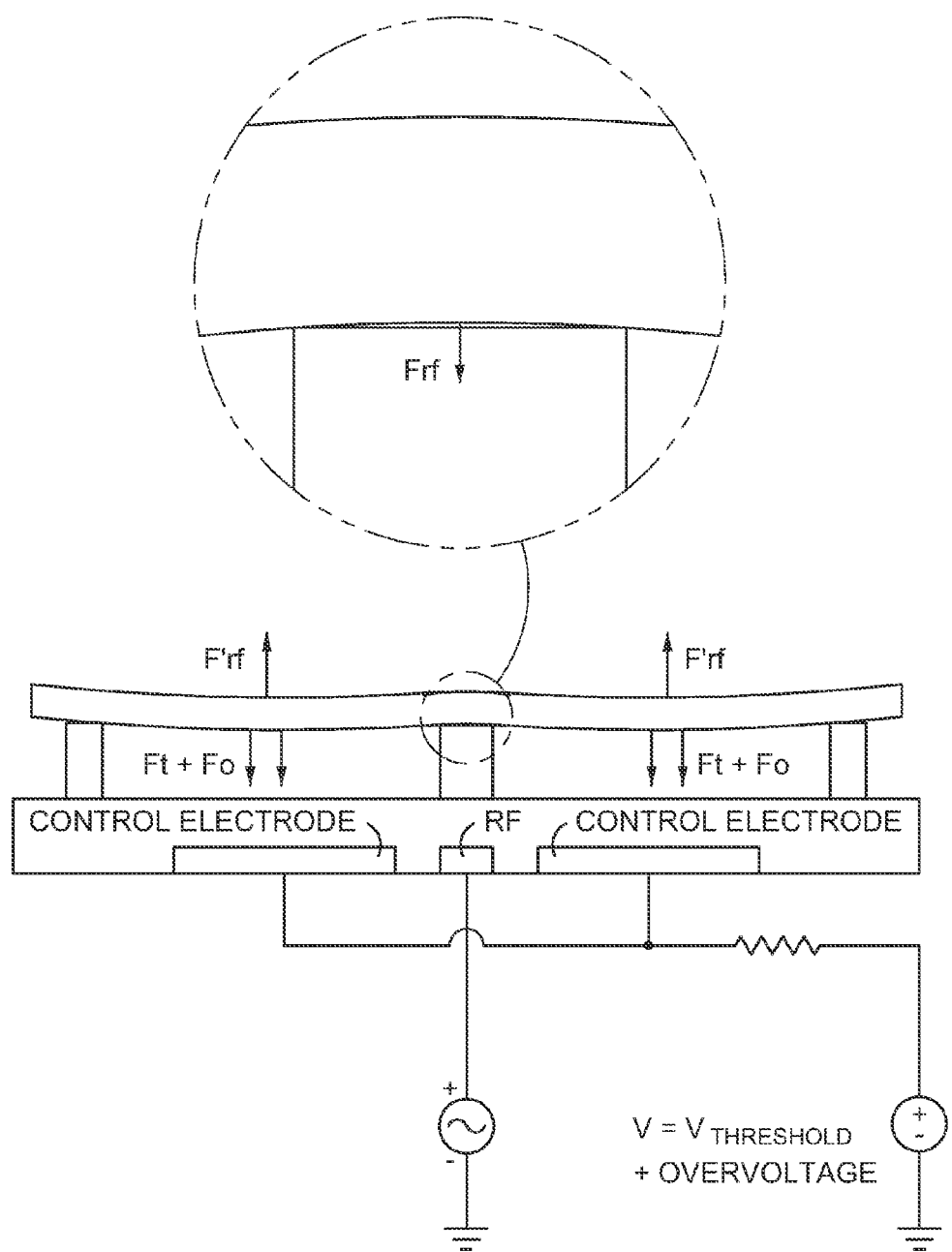
Figure 14D:
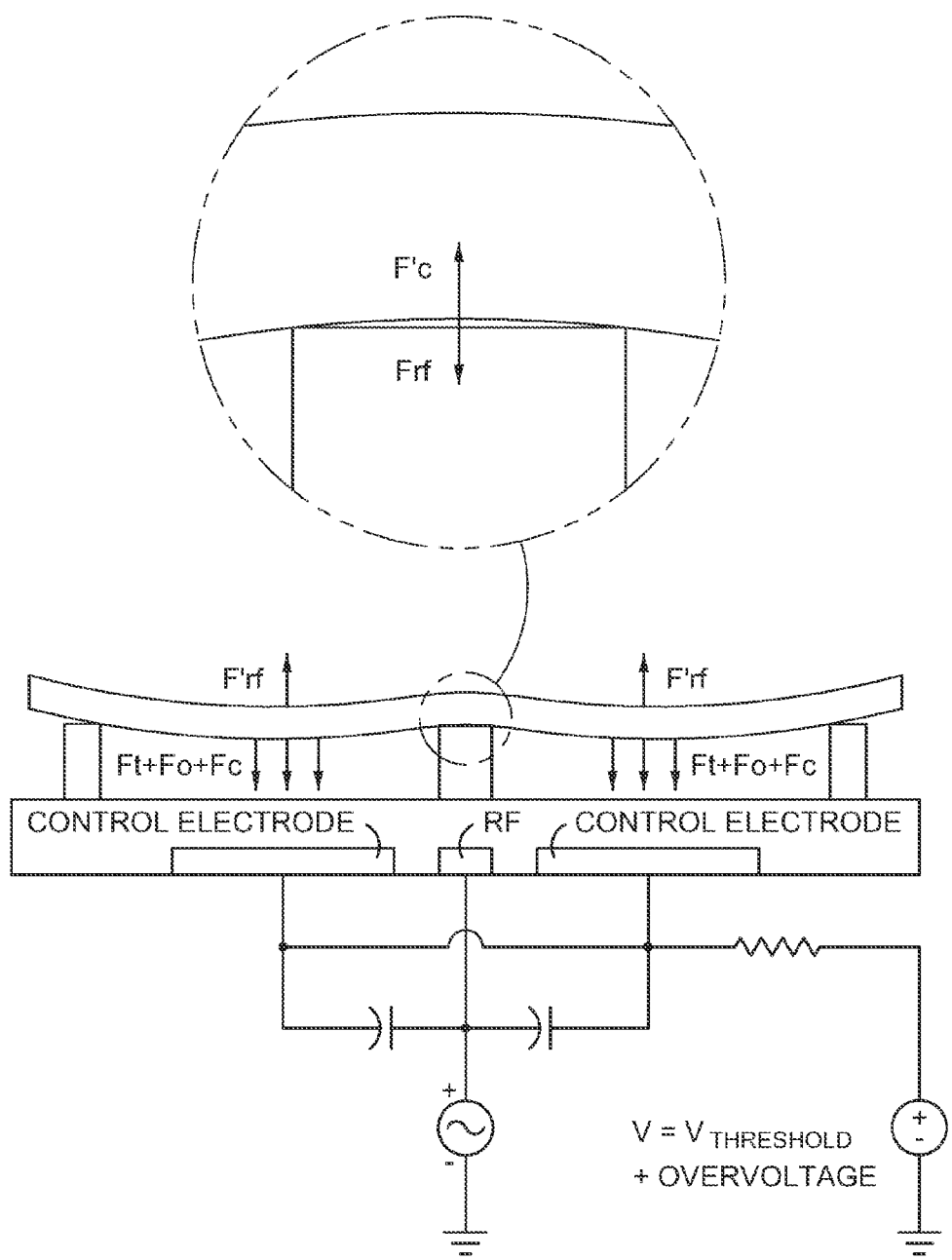

FIGS. 14A-14D shows a design exploiting the reduced E-field design in order to limit inter-modulation distortion by coupling of the RF signal to the ac-floating control electrodes. FIG. 14A shows the ideal condition of the MEMS device at the threshold voltage applied to the bottom electrodes: the membrane is perfectly flat on top of the RF electrode stopper, since the threshold electrostatic force Ft is perfectly balancing the restoring force of the membrane. This condition can, in practice, never occur as some over-voltage applied to the control-electrodes will always be applied for stable operation. This situation is shown in FIG. 14B: the extra electrostatic force Fo due to the applied over-voltage generates a sagging of the membrane on top of the control electrodes and consequently a rise of the membrane on top of the RF stopper. In FIG. 14C RF power is applied: some effective electrostatic force Frf due to the rms voltage will be applied to the membrane on top of the RF stopper. The torque effect around the contact points will generate a reverse direction force F'rf on the membrane on top of the control electrodes and as a consequence the membrane will become flatter. This deformation of the membrane as result of RF power is the origin of intermodulation distortion, because it modulates the capacitance. In FIG. 14D, the design provides for capacitive coupling of part of the RF power to the actuation electrodes, which are made ac-floating by using a series resistor. This coupled ac signal generates an electrostatic force on top of the control electrode Fc, and a force of opposite direction F'c on top of the RF stopper due to torque around the contact points. This force compensates, partially, the deformation generated by RF power: the deformation of the membrane is limited and therefore inter-modulation distortion is also reduced.

Figure 15:
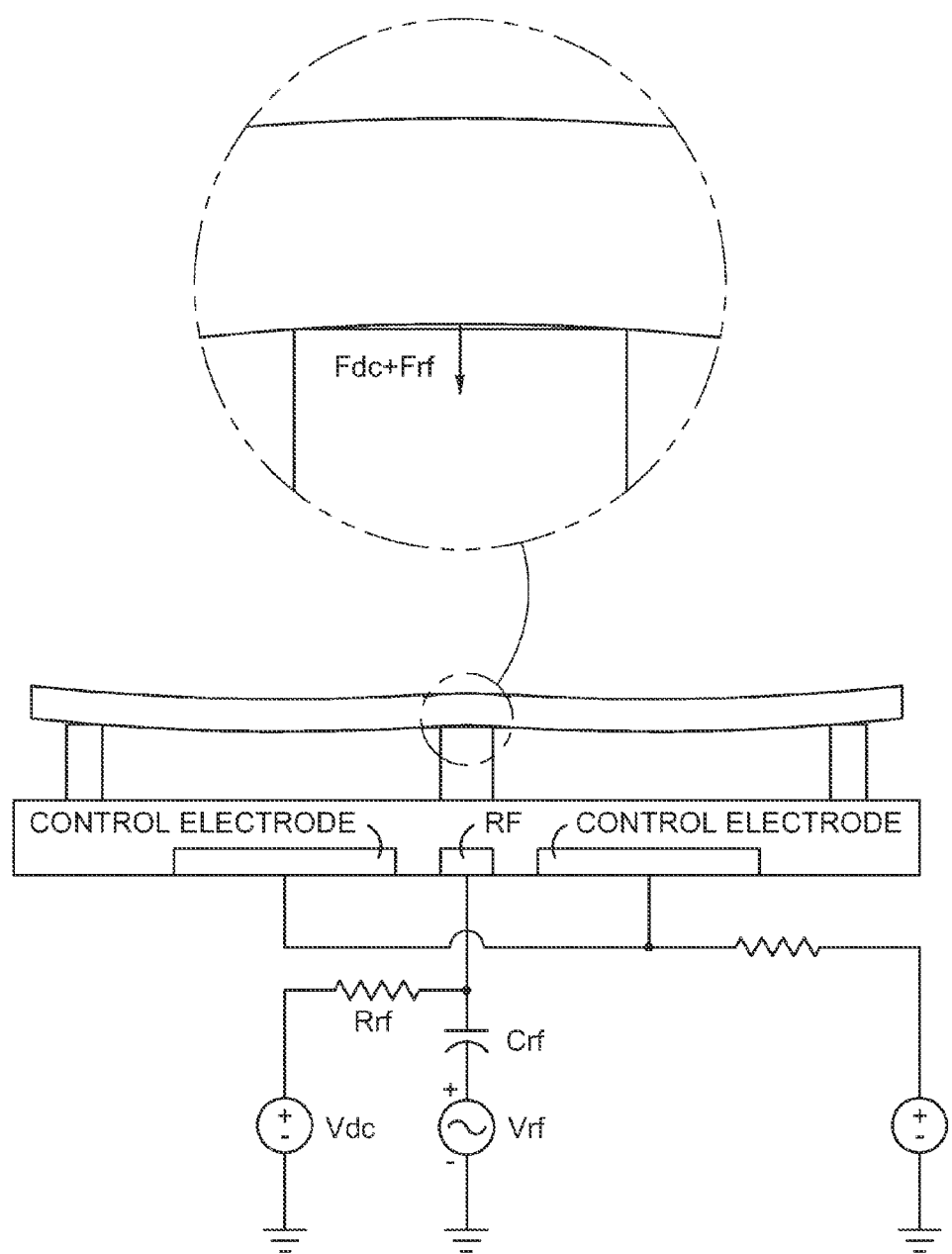
FIG. 15 shows a design exploiting the use of a bias resistor and coupling capacitor to facilitate applying a DC force on the membrane in the region of the RF electrode to pull the membrane intimately in contact with the RF electrode in order to limit inter-modulation distortion.

FIG. 15 shows a design exploiting the use of a bias resistor and coupling capacitor to facilitate applying a DC force on the membrane in the region of the RF electrode to pull the membrane intimately in contact with the RF electrode in order to limit inter-modulation distortion.

The bias resistor Rrf provides for the isolation of the RF-signal while the coupling capacitor Crf allows for the RF signal to be coupled into the RF-electrode of the MEMS variable capacitor device. The application of a DC bias voltage on the RF-electrode results in an electrostatic force Fdc which pulls the membrane intimately in contact with the RF-electrode. This ensures that with an applied RF power the capacitance does not further modulate, which improves the inter-modulation distortion.

Etching the Bumps Away

Figure 11:
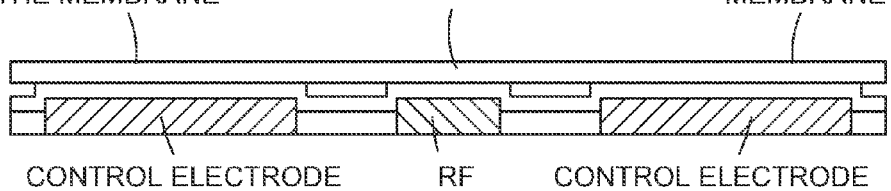
FIG. 11 shows how the etch corrects the collapsing membrane on the control and RF electrodes.
Figure 12B:
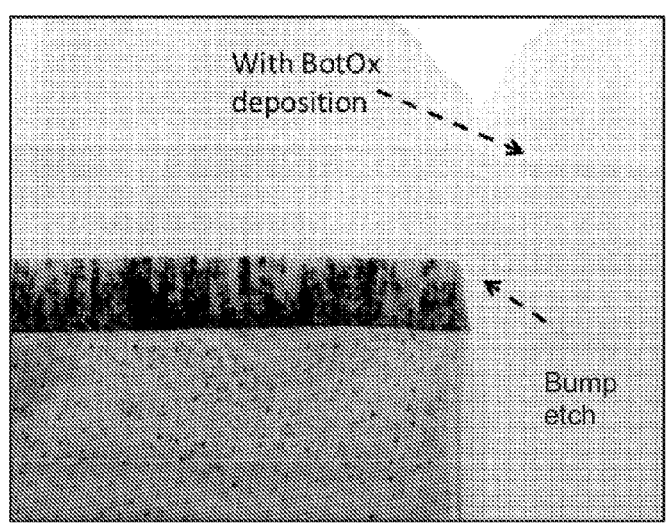
FIG. 12B shows results of using the etch approach.

Etching the bumps removes the problem completely. The process description in FIGS. 10A-10E shows how the etch step leaves clean/flat features under the membrane (FIG. 11), and therefore the inter-modulation performance of the MEMS digital variable capacitor improves. It is contemplated that both the slotted RF and control electrodes and the etch may be used in combination. FIG. 12B shows TEM results after using the etch approach.

As shown in FIGS. 10A-10E, a substrate has two control electrodes and an RF electrode disposed therein with a dielectric layer formed thereover. The dielectric layer may be polished back using a CMP process or other technique such as grinding so as to expose the control electrodes and the RF electrode. In so doing, bumps/stoppers are formed over at the upper surface edges of the slotted-electrodes. The bumps/stoppers are formed of the dielectric material. Next, a dielectric etching process occurs to further etch back the dielectric layer to a level below the control electrodes and RF electrode. The etching also removes the bumps/stoppers. Thereafter, another dielectric layer may be deposited thereover, but in so forming, the dielectric layer is conformally deposited such that the dielectric layer is substantially planar over the RF electrode and the control electrodes. Thereafter, a sacrificial layer may be formed thereover and the membrane may be formed thereover. The sacrificial layer will eventually be removed so that the membrane may move from a position spaced from the dielectric layer to a position in contact with the dielectric layer. The membrane will move when an electrical bias is applied to the control electrodes. When it moves towards the substrate, the membrane will rest substantially flat against the dielectric layer that is disposed over the control electrodes and the RF electrode. Thus, little or no deflection of the membrane will occur when applying an RF voltage to the RF electrode (as shown in FIG. 11).

While the foregoing is directed to embodiments of the present invention, other and further embodiments of the invention may be devised without departing from the basic scope thereof, and the scope thereof is determined by the claims that follow.

The invention claimed is:

1. A MEMS variable capacitor, comprising:
   a substrate having one or more control electrodes and one or more RF electrodes disposed therein;
   a top electrode; and
   a membrane movable between the substrate and the top electrode, wherein one or more of the substrate and the membrane have bumps formed thereover to control the spacing between the membrane and either the top electrode or both the one or more control electrodes and one or more RF electrodes;
   wherein the top electrode has one or more dielectric plugs disposed therein at locations corresponding to the bumps formed over the membrane such that when the membrane moves to contact the top electrode, the bumps will contact the dielectric plugs.

2. The MEMS variable capacitor of claim 1, wherein the bumps are additionally formed over the substrate.

3. The MEMS variable capacitor of claim 2, wherein at least one bump of the bumps is formed directly over the one or more RF electrodes.

4. The MEMS variable capacitor of claim 3, wherein the one or more RF electrodes com rises one or more slotted RF electrodes, wherein the one or more control electrodes comprises one or more slotted control electrodes: and wherein a bump of the bumps disposed over the one or more slotted RF electrodes extends above the substrate for a distance that is substantially equal to a distance that bumps disposed over the one or more slotted control electrodes extend.

5. A method of fabricating a MEMS variable capacitor, comprising:
   polishing a first dielectric layer that is formed over a substrate so as to expose one or more control electrodes and one or more RF electrodes embedded within the substrate, the polishing resulting in bumps formed at upper surface edges of the one or more control electrodes and the one or more RF electrodes;
   depositing a second dielectric layer over the one or more control electrodes and the one or more RF electrodes, wherein the second dielectric layer is conformal over the one or more control electrodes and the one or more RF electrodes such that the bumps are present;
   depositing a sacrificial layer over the second dielectric layer;
   forming a membrane over the sacrificial layer; and
   removing the sacrificial layer such that the membrane is movable from a position spaced from the second dielectric layer and a position in contact with the second dielectric layer.

6. The method of claim 5, wherein the one or more control electrodes comprises two control electrodes.

7. The method of claim 6, wherein the one or more control electrodes are slotted control electrodes.

8. The method of claim 7, wherein the one or more RF electrodes are slotted RF electrodes.

9. The method of claim 5, a bump of the bumps disposed over the one or more RF electrodes extends above the substrate for a distance that is substantially equal to a distance that bumps disposed over the one or more control electrodes extend.

10. A method of fabricating a MEMS variable capacitor, comprising:
    polishing a first dielectric layer that is formed over a substrate so as to expose one or more control electrodes and one or more RF electrodes embedded within the substrate, the polishing resulting in bumps formed at upper surface edges of the one or more control electrodes and the one or more RF electrodes;
    depositing a second dielectric layer;
    depositing a sacrificial layer over the second dielectric layer;
    forming a membrane over the sacrificial layer; and
    removing the sacrificial layer such that the membrane is movable from a position spaced from the second dielectric layer and a position in contact with the second dielectric layer;
    following the polishing, etching the first dielectric layer and the bumps such that the one or more control electrodes and the one or more RF electrodes extend above the first dielectric layer.

11. The method of claim 10, wherein the one or more control electrodes comprises two control electrodes.

12. The method of claim 11, wherein the one or more control electrodes are slotted control electrodes.

13. The method of claim 12, wherein the one or more RF electrodes are slotted RF electrodes.

* * * * *